(12) United States Patent
Khoche et al.

(10) Patent No.: US 7,457,729 B2
(45) Date of Patent: Nov. 25, 2008

(54) MODEL BASED TESTING FOR ELECTRONIC DEVICES

(75) Inventors: Ajay Khoche, San Jose, CA (US); Nicholas B Tufillaro, San Francisco, CA (US); Stanley T. Jefferson, Palo Alto, CA (US); Lee A. Barford, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 215 days.

(21) Appl. No.: 11/098,080

(22) Filed: Apr. 4, 2005

(65) Prior Publication Data

US 2006/0155411 A1 Jul. 13, 2006

Related U.S. Application Data

(60) Provisional application No. 60/643,315, filed on Jan. 11, 2005.

(51) Int. Cl.
*G06F 17/50* (2006.01)
*G01D 3/00* (2006.01)

(52) U.S. Cl. .......................... 703/1; 702/109
(58) Field of Classification Search ............. 703/1, 703/2, 22; 700/108; 702/109
See application file for complete search history.

(56) References Cited

U.S. PATENT DOCUMENTS

| 6,560,503 | B1 * | 5/2003 | Toprac et al. ........... 700/108 |
| 6,560,568 | B1 * | 5/2003 | Singhal et al. ........... 703/2 |
| 6,711,723 | B2 * | 3/2004 | Tsai et al. ............... 716/4 |
| 6,775,646 | B1 * | 8/2004 | Tufillaro et al. ......... 703/2 |
| 2004/0098215 | A1 | 5/2004 | Gee et al. |
| 2006/0026481 | A1 * | 2/2006 | Monnerat .............. 714/741 |
| 2006/0085681 | A1 * | 4/2006 | Feldstein et al. ........ 714/25 |

OTHER PUBLICATIONS

Larry Apfelbaum et al. (Model Based Testing, May 1997).*

* cited by examiner

*Primary Examiner*—Paul L Rodriguez
*Assistant Examiner*—Andre Pierre Louis
(74) *Attorney, Agent, or Firm*—Holland & Hart, LLP

(57) ABSTRACT

The model-based method tests compliance of production devices with the performance specifications of a device design. The production devices are manufactured in accordance with the device design by a manufacturing process. In the method, a simple model form based on the device design and the performance specifications is developed, a stimulus for testing the production devices is specified and each production device is tested. The model form has a basis function and model form parameters for the basis function. The model form parameters are dependent on the manufacturing process and differ in value among the production devices. A production device is tested by measuring the response of the production device to the stimulus; extracting, using the model form, the values of the model form parameters for the production device from the measured response and the stimulus; and checking compliance of the production device with the performance specifications using the extracted values of the model form parameters.

37 Claims, 10 Drawing Sheets

MODEL BASED TESTING FOR ELECTRONIC DEVICES

CLAIM OF PRIORITY

This application claims priority under 35 USC §119(e) of pending U.S. provisional patent application No. 60/643,315 filed 11 Jan. 2005.

BACKGROUND

World markets have seen a tremendous increase in demand for electronic devices that employ analog or radio-frequency (RF) circuitry such as cellular phones, wireless LAN and WiFi components, oscilloscopes, and navigation systems. There is a corresponding demand for analog or RF components such as mixers, amplifiers, analog switches, converters, and transceivers. This increase in demand is forcing the industry to find cost effective ways to manufacture these devices. Device integration has been used to make manufacturing more efficient by reducing manufacturing and material costs, while at the same time improving reliability. While the fabrication costs of integrated devices are becoming less expensive, the cost of testing such devices remains high. Test costs for a given production device include a share of the cost of any test instrumentation required, as well as the time required for testing using that instrumentation. Pressure to keep test costs low will increase with the integration of devices into consumer applications, which must have low overall cost.

The current high cost of analog or RF device testing is caused by a lack of good test methods. Unlike digital device testing, where structural test methods are used for device testing, most analog or RF device testing applies lengthy functional tests requiring expensive equipment. For example, time consuming and expensive functional tests include adjacent channel power measurement, channel selectivity, bit error rate (BER), and error vector magnitude (EVM). Each functional test checks compliance of the resulting performance metric with the corresponding performance specification for the device design. Furthermore, because functional tests often attempt to recreate the actual working environment of the device to measure performance metrics, simultaneous testing of multiple metrics can be difficult in functional testing protocols. Many current functional metric tests must run sequentially and/or use expensive equipment, which incurs very high costs. Also, the coverage that these metric tests provide is not well understood, which results in possibly redundant tests being included in the test flow. This increases costs and adds redundancy.

FIG. 1 shows a flow diagram of a conventional method for testing for the effect of process parameter variations on the performance metrics of a production device. The conventional test method does not specifically target defects. Instead, it directly measures the performance metrics of each production device and compares them to respective performance specifications of the device design to make a decision as to whether the production device is good or bad. In FIG. 1, in block 102, a first stimulus is applied to the production device. In block 104, the response of the production device to the first stimulus is measured. In block 106, a first performance metric for the production device is determined from the response measured in block 104. In block 106, the performance metric is typically determined by the automatic tester also used to perform above-described blocks 102 and 104. Alternatively, the determination is made by other known means. In block 108, test is performed to determine whether the first performance metric meets a first performance specification. If the test result is NO, the production device is classified as bad (block 110). If the test result in block 108 is YES, the process just described is repeated using a different stimulus to test a different performance metric. In all, N stimuli are sequentially applied to each production device and N responses are measured. A production device for which all N performance metrics tested meet respective performance specifications is classified as good and is released for sale (block 112). Alternatively, all N performance metrics may be determined before the compliance of the performance metrics with respective performance specifications is determined.

Other methods have been proposed that attempt to use a single measurement or a small set of measurements to derive a larger set of performance metrics for the production device. In these methods, alternative (non-functional) measurements of the production device are taken. The alternative measurements are meant to provide a signature for the production device. The signature is then regressed over the conventional performance metrics. The alternative measurements are designed to give required resolution in the regression for the targeted performance metrics. However, such prior art methods may miss some of the behaviors that may be relevant for detecting device defects. Also, because some prior art methods have used linear relationships to derive performance metrics, they have been inherently limited to production devices whose behavior is capable of being modeled using linear modeling. Also, prior art methods that use stimulus-response measurements must be carefully designed with full knowledge of the tests that will be used select a tuned stimulus, and are not readily adaptable to additional measurements of performance metrics.

SUMMARY

In a first aspect, the invention provides a model-based method for testing compliance of production devices with the performance specifications of a device design. The production devices are manufactured in accordance with the device design by a manufacturing process. The method comprises developing a simple model form based on the device design and the performance specifications, specifying a stimulus for testing the production devices and testing each production device. The model form comprises a basis function and model form parameters for the basis function. The model form parameters are dependent on the manufacturing process and differ in value among the production devices. The testing comprises measuring the response of the production device to the stimulus, using the model form to extract the values of the model form parameters for the production device from the measured response and the stimulus, and checking compliance of the production device with the performance specifications using the extracted values of the model form parameters.

In a second aspect, the invention provides a method of generating a model-based testing protocol for testing compliance of production devices with the performance specifications of a device design. The performance devices are manufactured in accordance with the device design by a manufacturing process. The method comprises developing a model form based on the device design and the performance specifications, using the model form to specify a stimulus for use in testing the production devices, and incorporating the model form and a specification of the stimulus into the testing protocol. The model form comprises a basis function and model form parameters for the basis function. The model form parameters are dependent on the manufacturing process and differ in value among the production devices.

In a third aspect, the invention provides a method for performing model-based testing of compliance of production devices with the performance specifications of a device design. The performance devices are manufactured in accordance with the device design by a manufacturing process. The method comprises receiving a test protocol for testing the production devices and testing each production device in accordance with the test protocol. The testing protocol comprises a simple model form based on the device design and the performance specifications, model form parameters for the model form, and a specification of a stimulus for use in testing the production devices. The model form parameters are dependent on the manufacturing process and differ in value among the production devices. Testing the production device comprises measuring the response of the production device to the stimulus, using the model form to extract values of the model form parameters for the production device from the measured response and the stimulus, and checking compliance of the production device with the performance specifications using the values of the model form parameters.

In contrast with the conventional testing method described above with reference to FIG. 1, in accordance with the method, no more than a single stimulus is typically applied to each production device and a corresponding response is measured. The simple model form enables a single set of stimulus/response data to be used to check whether each production device complies with its performance specifications. Reducing the number of stimulus applications and corresponding response measurements performed for each production device substantially increases the productivity of production line testers and hence reduces the cost of testing the production device.

DETAILED DESCRIPTION

Figure 1:
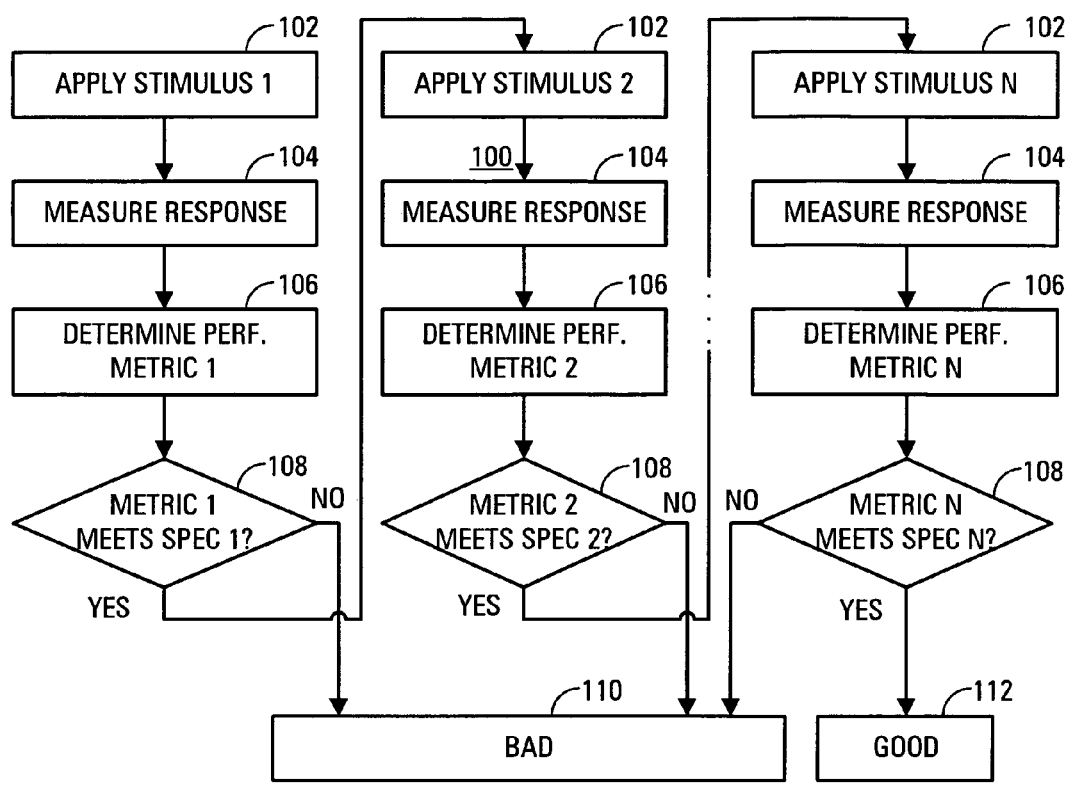
FIG. 1 is a flow diagram showing a conventional method for testing a production device.

As used in this disclosure, the term device will be used to denote an electronic module having more than one functional block. A device may be an electronic product in the form in which such product is sold to an end-user or may be part of such electronic product. A device has a structure defined by a device design. A manufacturing process defined by process parameters is used to manufacture devices in accordance with the device design. Such devices are referred to herein as production devices.

The performance of a device design is specified by performance specifications of the device design. Production devices are each tested to determine whether performance metrics of the production device comply with the corresponding performance specifications of the device design. A production device whose performance metrics all comply with the corresponding performance specifications is classified as GOOD by the production testing and is released for sale.

Embodiments of the method in accordance with the invention allow compliance of each production device with the performance specifications of the device design to be determined without the need to test each performance metric individually. This significantly increases the productivity of production line test equipment and reduces the cost of testing the production devices.

Electronic devices may fail to work as designed for numerous reasons. Generally, these reasons fall into two categories. First, a device may have a random defect that causes it to fail completely. Second, the device may generally operate as designed but does not meet at least one performance specification for its operation. For example, a device may transmit at a desired frequency, but may not produce power above a specified threshold at that frequency. This defect type is typically the result of a process parameter variation, i.e., a variation in one of the parameters of the process used to manufacture the device. As used herein, the term defect refers to both a random defect and a defect resulting from process parameter variations.

It is known in the art to generate a mathematical model of an electronic device and to use such mathematical model to predict performance metrics for the device. An example of such mathematical model is known as SPICE. Known mathematical models are complex: a typical model has tens of thousands of parameters. Known mathematical models are far too computationally intensive to be useable for testing electronic devices in mass production. Moreover, although such mathematical models can determine the effects of process parameter variations on the performance metrics of a modeled device, the use of such models requires a determination of the values of the actual process parameters applicable to each production device. Determining the values of such process parameters is often difficult. Therefore, conventional mathematical models are impractical for use in testing production devices.

Embodiments of the invention are based on two discrete concepts. The first concept is that, for a given device design, a simple model form can be developed using no more than a few tens of model form parameters. Such model form is sensitive to process parameter variations and is capable of modeling the device design to a specified accuracy with respect to the performance specifications of the device design. Even complex device designs, including such nonlinear device designs as transmitters and transceivers, can be modeled with sufficient accuracy for production line testing using a model form having fewer than 100 model form parameters. The simple model form mathematically models the behavior of the device design with respect to the performance specifications of the device design. Hence, the simple model form additionally mathematically models the behavior of production devices fabricated in accordance with the device design. The model form comprises a basis function of non-linear equations and model form parameters for the basis function. The basis function and the model form parameters are the same for all production devices made in accordance with the device design. The model form parameters differ in value among the production devices.

The second concept is that a single test (as opposed to the many tests performed in the conventional testing described above with reference to FIG. 1) can be performed on each production device, values of the model form parameters can be extracted from the results of the single test using the simple model form, and the simple model form with the values of the extracted model form parameters inserted models the device design with an accuracy sufficient to allow compliance of the performance metrics of the production device with the performance specifications of the device design to be reliably determined.

Figure 2A:
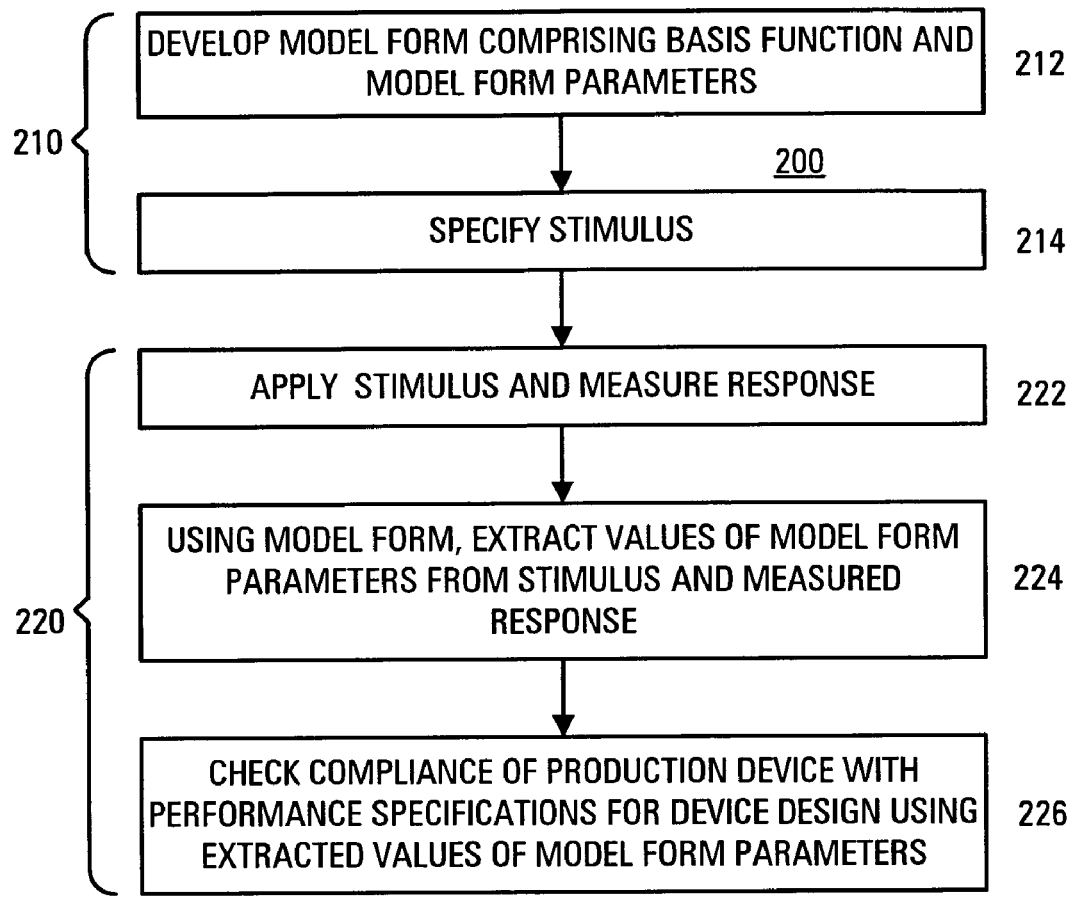
FIG. 2A is a flow diagram providing an overview of a model-based testing process in accordance with an embodiment of the invention.

FIG. 2A is a flow diagram that provides an overview of a model-based testing method in accordance with an embodiment of the invention. Three examples of the model-based testing method in accordance with an embodiment of the invention will be described below with reference to FIGS. 2B-2D. Elements of the flow diagrams shown in FIGS. 2B-2D that correspond to elements of the flow diagram shown in FIG. 2A are indicated using the same reference numerals and will not be described again in the descriptions of FIGS. 2B-2D.

Referring first to FIG. 2A, model-based testing method 200 has a development phase 210 and a production phase 220. In development phase 210, a test protocol for use in model-based testing compliance of production devices with the performance specifications of the device design is developed. The production devices are manufactured in accordance with a device design by a manufacturing process. In the production phase 220, each production device manufactured by the manufacturing process in accordance with the device design is tested in accordance with the test protocol developed in the development phase 210. Each production device is tested to determine whether it complies with the performance specifications of the device design.

Development phase 210 comprises a block 212 and a block 214. In block 212, a simple model form for the device design is developed. The simple model form is for use in testing production devices manufactured in accordance with the device design for compliance with the performance specifications of the device design. The simple model form is based on the device design and the performance specifications of the device design, and comprises a basis function and model form parameters. The basis function is a set of non-linear equations. With appropriate values of the model form parameters inserted, the model form mathematically models the behavior of one or more development devices in accordance with the device design. Simple device designs may be modeled using a model form whose basis function is composed of a single non-linear equation. The development devices used to develop the model form in block 212 can be actual devices manufactured in accordance with the device design or can be one or more simulated devices in accordance with the device design.

In block 214, a stimulus for use in testing production devices manufactured in accordance with the device design is specified.

Development phase 210 generates a test protocol for use in testing production devices. The test protocol comprises the model form developed in block 212 and the stimulus specified in block 214.

Production phase 220 is composed of a block 222, a block 224 and a block 226. Production phase 220 is applied to each production device. Aspects of the production phase are defined by the test protocol developed in development phase 210.

In block 222, the stimulus specified in block 214 is applied to the production device and the response of the production device to the stimulus is measured.

In block 224, the model form developed in block 212 is used to extract values of the model form parameters of the model form from a set of stimulus data representing the stimulus specified in block 214 of development phase 210 and a set of response data representing the measured response of the production device to the stimulus. The model form and a fitting process are used to extract the values of model form parameters from the stimulus data and the response data. The values of the model form parameters extracted are those that, when incorporated in model form to form a simple model of the production device, give a close match between a calculated response of the model of the production device to the stimulus and the measured response of the production device to the stimulus.

In block 226, compliance of the production device with the performance specifications of the device design is checked using the values of the model form parameters. In the examples described below with reference to FIGS. 2B and 2C, compliance of the production device with the performance specifications of the device design is checked by checking compliance of performance metrics projected from the values of the model form parameters extracted in block 224 with respective ones of the performance specifications. The example described below with reference to FIG. 2B projects the performance metrics in a different way from the example described below with reference to FIG. 2C. In the example described below with reference to FIG. 2D, compliance of the production device with the performance specifications of the device design is checked by checking compliance of the values of the model form parameters with the performance specifications of the device design transformed into the model form parameter space.

Figure 2B:
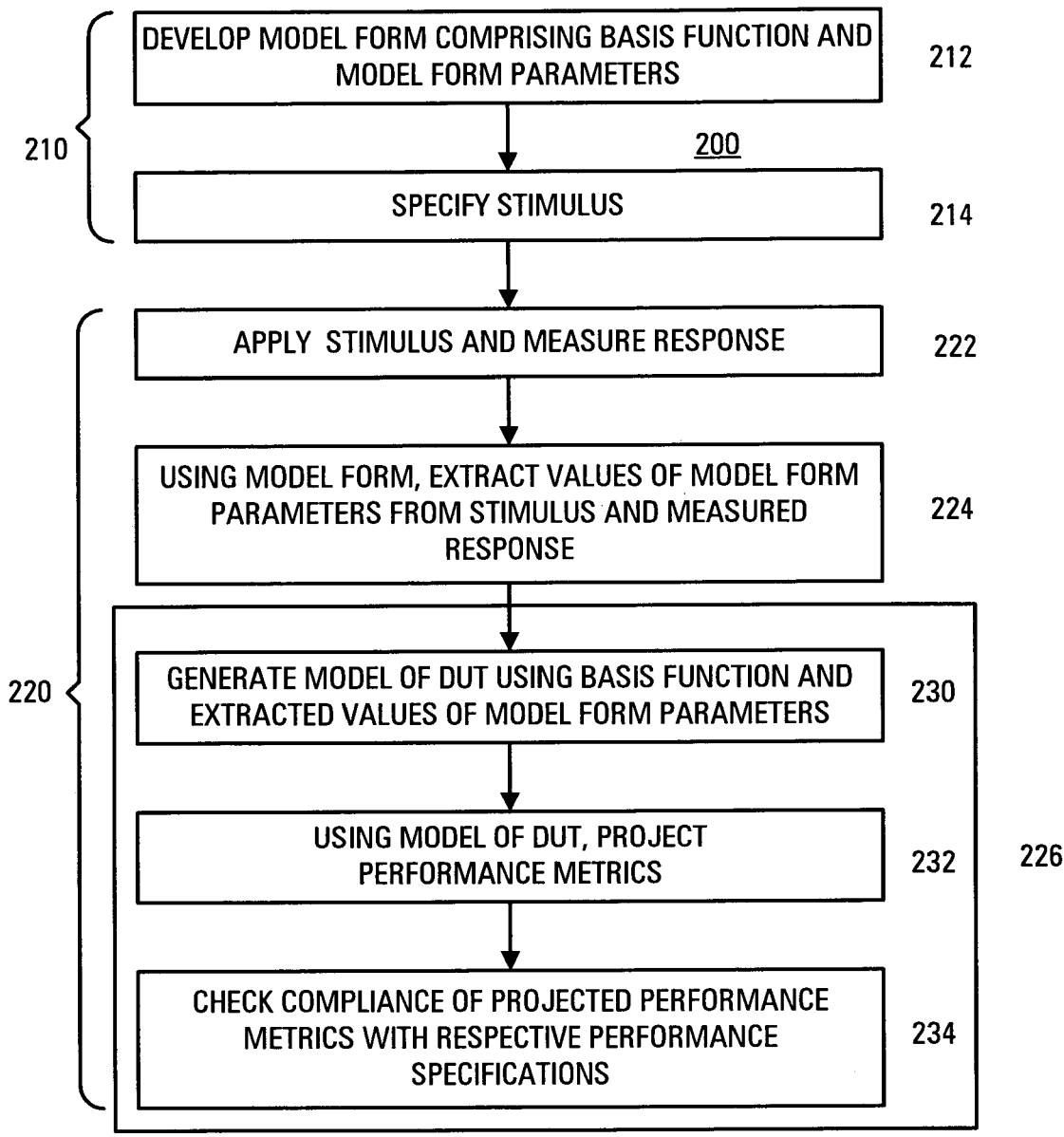
FIG. 2B is a flow diagram of a first example of a model-based testing process in accordance with an embodiment of the invention.

FIG. 2B is a flow diagram of a first example of a model-based testing process in accordance with an embodiment of the invention. In the production phase 220 of the example shown in FIG. 2B, a behavioral model of each production device is generated and the performance metrics of the production device are determined using the behavioral model.

As noted above, in production phase 220, the processes described above with reference to blocks 222, 224 and 226 are applied to each production device. The embodiment of block 226 in the example shown in FIG. 2B is composed of blocks 230, 232 and 234. In block 230, the values of the model form parameters extracted in block 224 for the production device are inserted into the model form to generate a simple model of the production device. In block 232, performance metrics for the production device are projected using the simple model. Typically, the projection involves calculating responses of the simple model to one or more simulated stimuli. The calculated responses, or values derived from the calculated responses, then constitute the projected performance metrics for the production device. In block 234, compliance of the performance metrics projected in block 232 with respective ones of the performance specifications is checked. A production device whose projected performance metrics all comply with their respective performance specifications is classified as good and is accepted.

Modeling each production device in block 230 using a simple model form with fewer than a few tens of model form parameters enables the performance metrics of the production device to be projected in a time comparable with the time needed to measure the response of the production device in block 222. The projection process uses computational power comparable with that available in current automatic testers or that can conveniently be added to and supported by such testers. Alternatively, the performance metrics can be projected using a computer or other computing device external of the automatic tester.

Figure 2C:
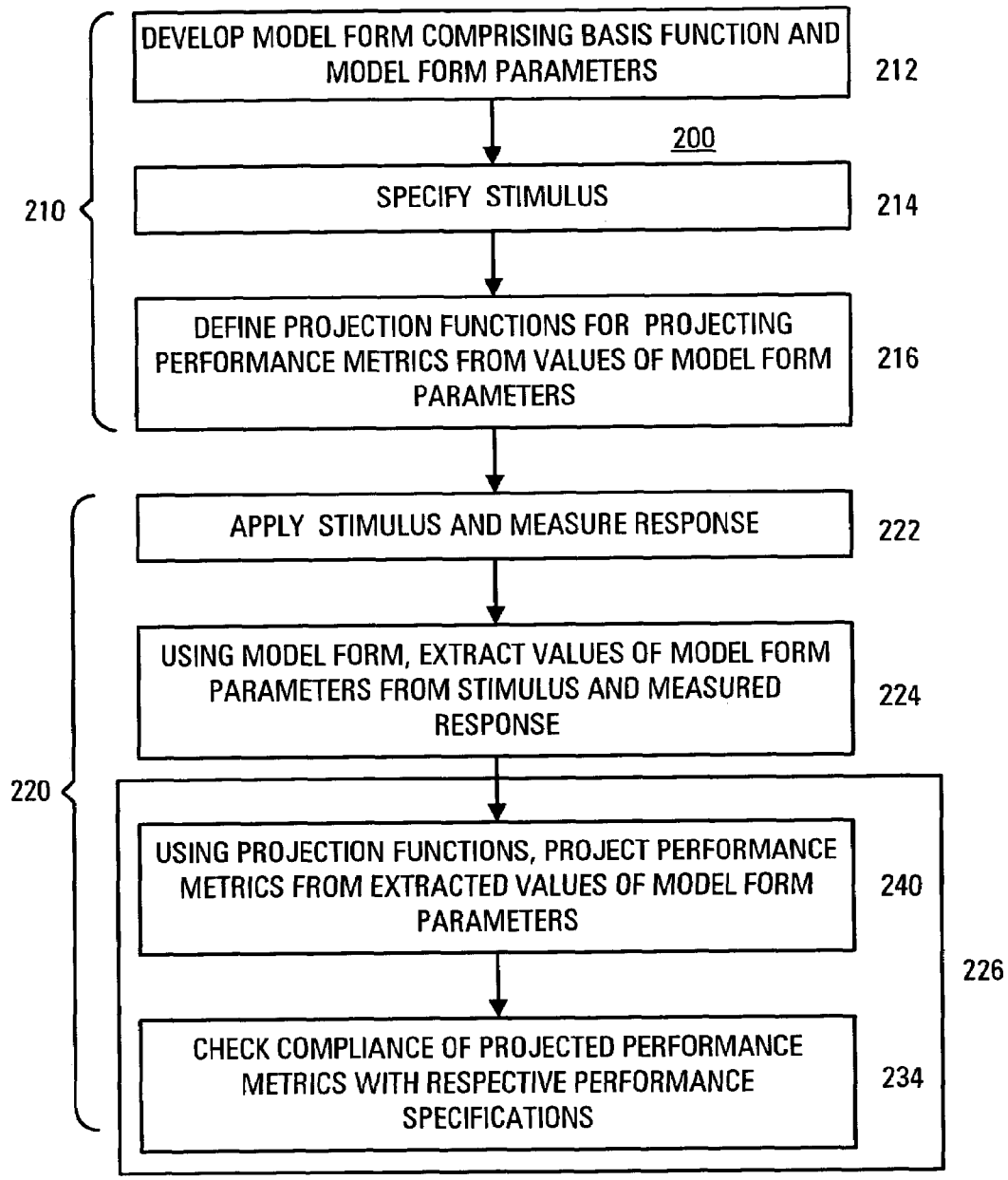
FIG. 2C is a flow diagram of a second example of a model-based testing process in accordance with an embodiment of the invention.

FIG. 2C is a flow diagram of a second example of a model-based testing process in accordance with an embodiment of the invention. The example shown in FIG. 2C uses a less computationally-intensive way of projecting the performance metrics from the extracted values of the model form parameters than that shown in FIG. 2B.

The development phase 210 of the example shown in FIG. 2C additionally comprises a block 216 in which projection functions are developed for use in production phase 220 for projecting the performance metrics of each production device from the extracted values of the model form parameters for the production device. The projection functions constitute an additional component of the test protocol generated by development phase 210. Development of the projection functions will be described in more detail below.

In the production phase 220 of the example shown in FIG. 2C, the embodiment of block 226 is composed of a block 240 and block 234. In block 240, the projection functions developed in block 216 are used to project the performance metrics for each production device from the values of the model form parameters extracted in block 224 for the production device. Projecting the performance metrics using projection functions is computationally less intensive than projecting the performance metrics using the full simple model, as described above with reference to block 232 of FIG. 2B. In block 234, compliance of the performance metrics projected in block 240 with respective ones of the performance specifications is checked as described above with reference to block 234 of FIG. 2B.

Figure 2D:
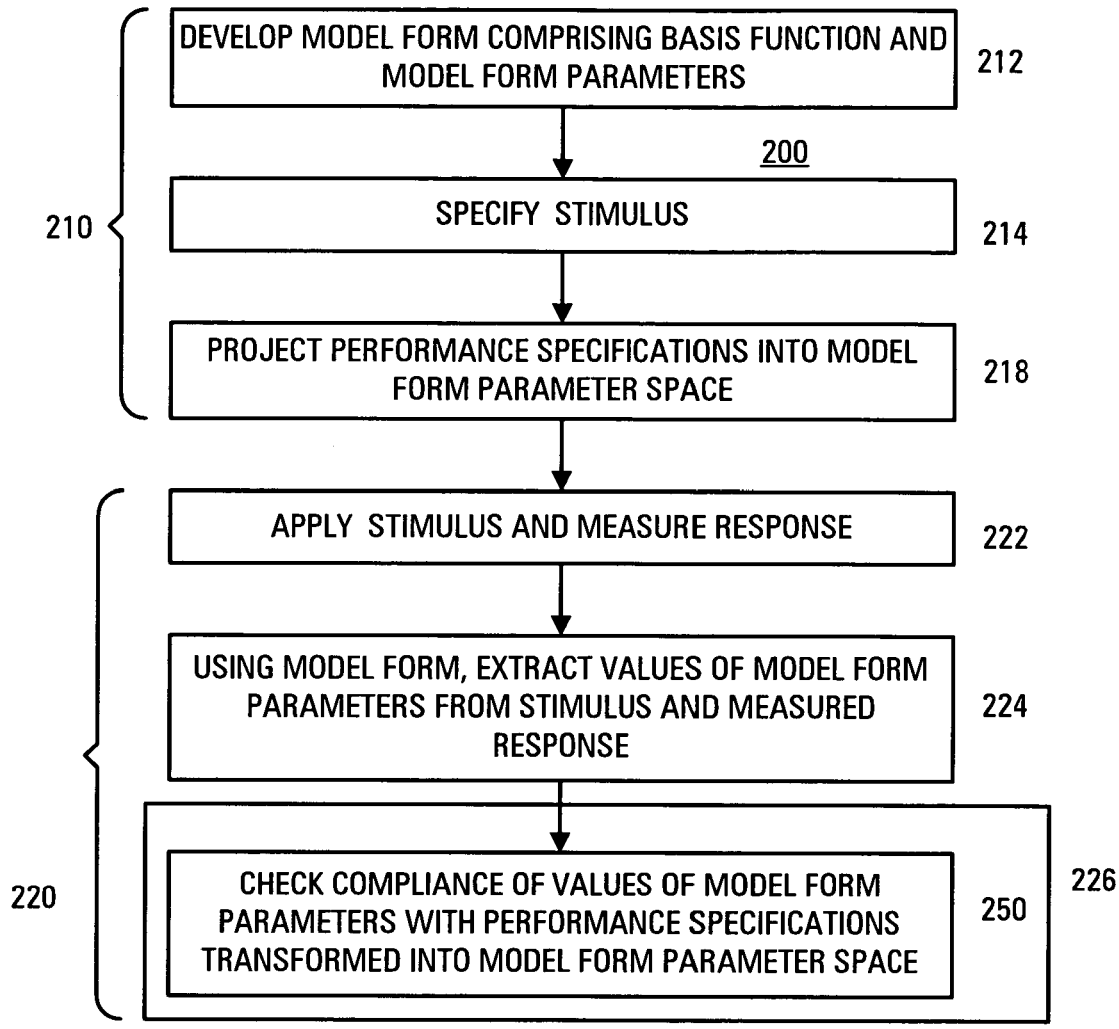
FIG. 2D is a flow diagram of a third example of a model-based testing process in accordance with an embodiment of the invention.

FIG. 2D is a flow diagram of a third example of a model-based testing process in accordance with an embodiment of the invention. In the example shown in FIG. 2D, the computational intensity is further reduced compared with that of FIG. 2D by eliminating the projection of performance metrics from the values of the model form parameters extracted for each production device.

The development phase 210 of the example shown in FIG. 2D additionally comprises block 218 in which the performance specifications of the device design are transformed into the model form parameter space. Conventionally, and in the examples described above with reference to FIGS. 2B and 2C, the performance specifications define the properties of an acceptable production device in terms of limits on the performance metrics of the production device. In the example shown in FIG. 2D, the performance specifications are transformed into the model form parameter space and the properties of an acceptable production device are defined in terms of limits on the values of the model form parameters of the production device. Thus, the performance specifications transformed into model form parameter space constitute limits for the values of the model form parameters. The transformations of the performance specifications of the device design into model form parameter space constitute an additional component of the test protocol generated by development phase 210.

In the production phase 220 of the example shown in FIG. 2D, the embodiment of block 226 is composed of a block 250. In block 250, compliance of the values of the model form parameters extracted for each production device in block 224 with the performance specifications transformed into model form parameter space is checked. A production device for which the model form parameters have values that all comply with the respective limits defined by the performance specifications transformed into model form parameter space is classified as good and is accepted.

Production devices that can be tested according to embodiments of the present invention are typically analog or RF devices. However, production devices with a mixture of analog components and digital components may be tested, and predominantly digital devices may be tested to the extent that their physical behavior comprises analog behavior.

To develop a behavioral model for a device design, a model form comprising a basis function and model form parameters for the basis function is developed for the device design using one or more development devices. The development devices can be sample production devices made in accordance with the device design or one or more simulated devices based on the device design. Alternatively, both sample production devices and simulated devices can be used.

A set of non-linear equations is initially selected as the basis function of the model form. To develop the model form, an appropriate stimulus is applied to each development device and a respective response of the development device to the stimulus is measured. The stimulus and the respective response of the development devices are used to determine whether the model form accurately models the behavior of the development devices with respect to the performance specifications of the device design. The initially-selected equations are used to extract values of the model form parameters from data representing the stimulus and the response of the development devices to the stimulus. The values of the model form parameters extracted are those that, when inserted into the initially-selected equations produce a model that most closely fits the measured behavior of the development devices with respect to the performance specifications of the device design. If the fit between the behavior of the model based on the initially-selected equations and the behavior of the development devices is unacceptable, the initially-selected equations are modified and the process just described is iterated until a behavioral model based on the non-linear equations and appropriate values of the model form parameters, accurately matches the measured or calculated behavior of the development devices. Once the behavioral model based on non-linear equations can accurately model the measured or calculated behavior of the development devices with respect to the performance specifications of the device design, they can be used as the basis function of the model form.

In many cases, embodiments of the invention allow the compliance of each production device with the performance specifications of the device design to be checked by applying a single stimulus to the production device and performing a single set of measurements of the response of the production device to the stimulus. This reduces the time and cost of production testing compared to conventional test systems and methods in which multiple stimuli are sequentially applied to each production device and respective measurements of the responses of the production device to the stimuli are made.

Such conventional testing may need an iterative process to determine compliance of each production device with the multiple conditions constituting its performance specifications.

The processes described above with reference to the flow diagrams shown in FIGS. 2A-2D will now be described in greater detail. Model development occurs at block 212. Here, a behavioral mathematical model, known as the model form, is developed to represent the physical behavior of a device design. The model form developed in block 212 is a function of the device design, the acceptable ranges the parameters of the process used to manufacture the production devices and the performance specifications of the device design. The capabilities of the test equipment used to provide the stimulus and measure the response of the production devices to the stimulus may also be taken into account in developing the model form. In an exemplary embodiment of the invention, the model form is developed in block 212 by taking input-output time domain samples of development devices. The development devices, also called training devices, are selected to cover the acceptable range of process parameter variations. Using such development devices enables a structure for the model form to be developed that is responsive to the process parameter variations expected in production devices based on the device design.

The model form developed in block 212 comprises a non-linear basis function and model form parameters. The non-linear basis function can be a polynomial function, or can be a basis function such as a radial basis function (RBFs), a neural net, etc. The basis function and model form parameters are the same for all production devices manufactured in accordance with a given device design, but the model form parameters differ in value among the production devices. In some embodiments, the model form is developed using the method of producing a behavioral model of a nonlinear device from embeddings of time-domain measurements described in U.S. Pat. No. 6,775,646, issued Aug. 10, 2004, and incorporated by reference. Other embodiments use other methods to develop the model form.

The model form development process is typically performed only once for each device design. However, the quality of the behavioral model is typically periodically validated from time-to-time during production. A process that can be used for validation of the model form will be described below with reference to FIG. 3A.

Physics-inspired model forms are used in certain embodiments of the present invention. An example of a physics-inspired model form is the following mathematical model for an amplifier:

$$v_{out}(t) = a_0 + a_1 v_{in}(t) + a_2 v_{in}(t)^2 + a_3 v_{in}(t)^3 + \ldots + a_n v_{in}(t)^n$$

representing a Taylor expansion about $v_{in}$. The model form is made up of model form parameters, $a_0, a_1, \ldots, a_n$, and a polynomial basis function. The model form exemplified above is non-linear due to the higher-order terms in $v_{in}(t)$. The model form development process is described in greater detail below in the description of FIG. 3A.

Once the model form is developed in block 212, a stimulus is specified in block 214. A stimulus is typically an electronic signal that is applied to each production device. The stimulus specified is one that, when applied to the production device, produces a response that can be measured to produce a measurement from which can be efficiently extracted the values of the model form parameters (e.g., values of $a_0, a_1, \ldots, a_n$) for the model form generated in block 212. Specifying the stimulus in block 214 also involves specifying a measurement of the response of the production device to the stimulus. The measurement specification takes into account the capabilities of the available test equipment.

In some embodiments, a stimulus rich in frequency content is specified. For example, a broad-band excitation waveform may be specified as the stimulus. A stimulus with sufficient frequency and phase content will allow the dynamic behavior of the production device to be accurately projected. In another example, a band-limited noise stimulus is specified. Other types of stimulus may be used.

Typically, a stimulus and corresponding response measurement are specified such that, when the stimulus is applied to each production device in block 222, the measurement of the response of the production device to the stimulus will produce response data that, together with stimulus data representing the stimulus, allows the values of the model form parameters to be extracted efficiently, i.e., quickly, accurately and without using excessive computational resources. In many cases, the stimulus specified in block 214 is the stimulus or one of the stimuli used in block 212 to develop the model form.

The efficiency or optimality with which production devices are tested in accordance with embodiments of the invention depends at least in part on the stimulus used, and the corresponding equipment required to provide such stimulus, the time and/or computational resources needed to extract the values of the model form parameters from the stimulus data representing the applied stimulus and the response data representing the measured response of the production device to the stimulus, and the accuracy of the extracted values of the model form parameters.

Stimulus specification in block 214 is typically performed in parallel with the model form development performed in block 212. Alternatively, the stimulus specification and the model form development may be interleaved in an iterative process.

Once a model form has been developed in block 212 and a stimulus has been specified in block 214, the model form and the stimulus can immediately become parts of a test protocol used for testing production devices in the production phase 220. More typically, the test protocol, comprising the model form and the stimulus specification, is stored, for example, on a computer-readable medium, for use later and, typically, elsewhere, in production phase 220. In one example, the model form is developed in block 212, the stimulus is specified in block 214 and the model form and the stimulus specification are then saved for use later and, typically, elsewhere, in the production phase to test the production devices manufactured in accordance with the device design.

The stimulus specification produced in block 214 typically describes the properties of the specified stimulus. The stimulus specification may alternatively be a set of waveform data that defines the waveform of the stimulus. In another possibility, the stimulus specification may constitute a set of instructions that cause a given piece or range of test equipment to generate a stimulus having the properties of the specified stimulus. The stimulus specification is typically stored in a machine-readable medium.

In the production phase 220, the processes described with reference to blocks 222, 224 and 226 are used to test the production devices. The processes described with reference to blocks 222, 224 and 226 are each applied to each production device.

In block 222, the stimulus specified in block 214 is applied to the production device and the response of the production device to the stimulus is measured to generate response data representing the response of the production device to the stimulus. The measurement performed in block 222 is also specified in block 214. One piece of test equipment applies the specified stimulus to the production device and another piece of test equipment measures the response to the production device to the stimulus. Alternatively, the stimulus is generated and the response is measured by respective modules of a single piece of test equipment, such as an automatic tester. In some cases, the specified stimulus is applied to more than one production device at a time and the responses of the production devices to the stimulus are measured simultaneously or sequentially.

In block 224, the model form developed in block 212 is used to extract values of the model form parameters for the production device from the stimulus data representing the stimulus and the response data generated by the measurement performed in block 222 of the response of the production device to the specified stimulus. The model form and a fitting process are used to extract the values of model form parameters from the stimulus data and the response data. In the example above using the classical mathematical model for an amplifier, $$v_{out}(t) = a_0 + a_1 v_{-in}(t) + a_2 v_{in}(t)^2 + a_3 v_{in}(t)^3 + \ldots + a_n v_{in}(t)^n,$$

the values of model form parameters, $a_0, a_1, \ldots, a_n$ are extracted from the stimulus data and the response data in block 224.

In block 226, compliance of the production device with performance specifications of the device design is checked using the values of the model form parameters extracted in block 224. A production device that complies with all the performance specifications is classified as good and is released for sale. Otherwise the production device is classified as bad and is returned for rework, or is scrapped.

In some embodiments, such as in the example described above with reference to FIG. 2D, compliance of the values of the model form parameters with the performance specifications of the device design transformed into the model form parameter space is checked in the embodiment 250 of block 226 shown in FIG. 2D. A production device having model form parameter values that all comply with the performance specifications transformed into the model form parameter space is classified as good and is accepted. A production device having one or more model form parameter values that fall outside the respective performance specification transformed into model form parameter space is classified as bad and is rejected. A production device having one or more of model form parameter values that are marginal with respect to the corresponding performance specification transformed into model form parameter space may be subject to further testing. The performance specifications transformed into model form parameter space are those produced in block 218 of development phase 210.

In other embodiments, such as in the examples shown in FIGS. 2B and 2C, performance metrics are projected from the values of the model form parameters in blocks 230 and 232 of the example shown in FIG. 2B or in block 240 of the example shown in FIG. 2C. In an exemplary RF device, examples of performance metrics that can be projected from the values of the model form parameters include power in the targeted channel, channel resistance, modulation quality, input intercept point 3 (IIP3), adjacent channel power ratio (ACPR). Compliance of the projected performance metrics with respective performance specifications is then checked in the block 234. A production device whose projected performance metrics all comply with the respective performance specifications is classified as good and is accepted. A production device having one or more performance metrics that fail to meet their respective performance specifications is classified as bad and is rejected. A production device having one or more performance metrics that are marginal with respect to their corresponding performance specifications may be subject to further testing.

As an example, one of the performance metrics projected in block 232 of FIG. 2B or in block 240 of FIG. 2C is the minimum transmission frequency of the device design. The projection determines that the production device can only transmit signals at frequencies above 830 MHz, whereas the corresponding performance specification for the device design specifies a minimum transmission frequency limit of 824 MHz. In this example, the production device would be classified in block 234 as bad and would be rejected. A log of performance metrics may additionally be generated in block 234. In an example, the log includes an entry recording the projected minimum transmission frequency of 830 MHz and the respective performance specification of 824 MHz. The log may additionally indicate that the production device is bad when the projected performance metric does not meet the respective performance specification.

Block 224, in which the values of the model form parameters are extracted using the model form, and block 226, in which compliance of the production device with its performance specifications is checked, are typically performed in real time using, for example, an automatic tester or other test instrumentation that is also used in block 222 to apply the stimulus to each production device and measure the response of the production device to the stimulus. Alternatively, one or both of blocks 224 and 226 may be performed by an external computer or other suitable test equipment. Performing one or both of blocks 224 and 226 offline further speeds the testing process by allowing the automatic tester to attend to other tasks, such as performing block 222 on the next production device. Commodity computing clusters can be used to perform one or both of blocks 224 and 226.

In examples in which an automatic tester performs blocks 224 and 226 in real time, a conventional automatic tester may be enhanced with the hardware necessary to enable the automatic tester to perform the operations involved. For example, an automatic tester may be adapted to perform the model-based testing process described above with reference to FIG. 2B by equipping it with a modelling engine. The modelling engine receives the values of the model form parameters for each production device, populates the model form with the values of the model form parameters for each production device to form a behavioral model of the production device and then projects the performance metrics of the production device using the behavioral model of the production device. More than one modelling engine can be installed in the automatic tester with the aim of ensuring that the rate at which the automatic tester tests production devices is limited by the rate at which the tester performs block 222 rather than the rate at which the tester performs block 226.

Similarly, the automatic tester can be equipped with one or more extraction engines. Each extraction engine extracts values of the model form parameters from the stimulus data and the response data. This ensures that the production test rate is limited by the rate at which the tester performs block 222 rather than the rate at which the tester performs block 224.

The time taken to apply the production phase 220 of model-based testing method 200 to each production device is less than the time required to perform the set of conventional tests in the conventional test process illustrated in FIG. 1. The production phase 220 of the model-based testing method 200 uses test equipment comparable in cost with the test equipment used to perform the set of conventional tests in the conventional test process illustrated in FIG. 1. On a fully-occupied automatic tester, halving, for example, the time taken to test each production device is equivalent to installing another automatic tester at no cost. Despite the reduction in the time taken to test each production device, the accuracy with which the production phase 220 characterizes the performance of the production device against the performance specifications of the device design is comparable to that provided by the set of conventional tests performed in the conventional test process illustrated in FIG. 1.

Further advantages of embodiments of the model-based testing method 200 in accordance with the invention over conventional production test techniques include the ability to test larger circuits with a greater accuracy and in a shorter test time. Also, the model form can be adjusted to trade off accuracy and speed. Also, versatile test equipment can often be used in place of or in addition to test-specific test equipment.

In accordance with the invention, a simple model form is developed for use in connection with testing production devices made in accordance with a device design. Model form development (block 212 of FIG. 2A) begins with the initial selection of a set of non-linear mathematical equations as the basis function of the model form. The initially-selected equations are equations that model the behavior of one or more development devices in accordance with the device design with respect to the performance specifications of the device design. The equations can be selected with the assistance of a computer-aided design (CAD) program. For example, the equations can be selected with the assistance of a CAD program that uses a conventional, complex model of the device design.

The simplicity of the model form comes from modelling the behavior of the device design with respect to the performance specifications of the device design, and ignoring behaviors of the device design that are not specified by the performance specifications. Model form parameters that have little or no relevance to the performance specifications can be ignored.

In one embodiment, the initially-selected equations are specific to a nominal device in accordance with the device design. The initially-selected equations are then tested using development devices and typically are modified to enable them to represent the behavior of the development devices with respect to the performance specifications of the device design. The behavior of the development devices typically differs, at least in part, from that of the nominal device.

A development device is a device in accordance with the device design. Preproduction samples made in accordance with the device design can be used as the development devices. Special pre-production samples can be made in accordance with the device design with various combinations of process parameters at the extremes of their allowed ranges. Such samples constitute what is known as a skewed lot or a rainbow lot. Simulated devices, simulated, for example, on a computer using simulation software may additionally or alternatively be used as development devices. Examples of simulation software include CAD software, SPICE software and ADS, an advanced design system sold by Agilent Technologies, Inc, Palo Alto, Calif. Again, process parameters at the extremes of their allowed ranges may be used in the simulations.

Model form development using development devices from skewed lots will be described next with reference to FIG. 3A.

Figure 3A:
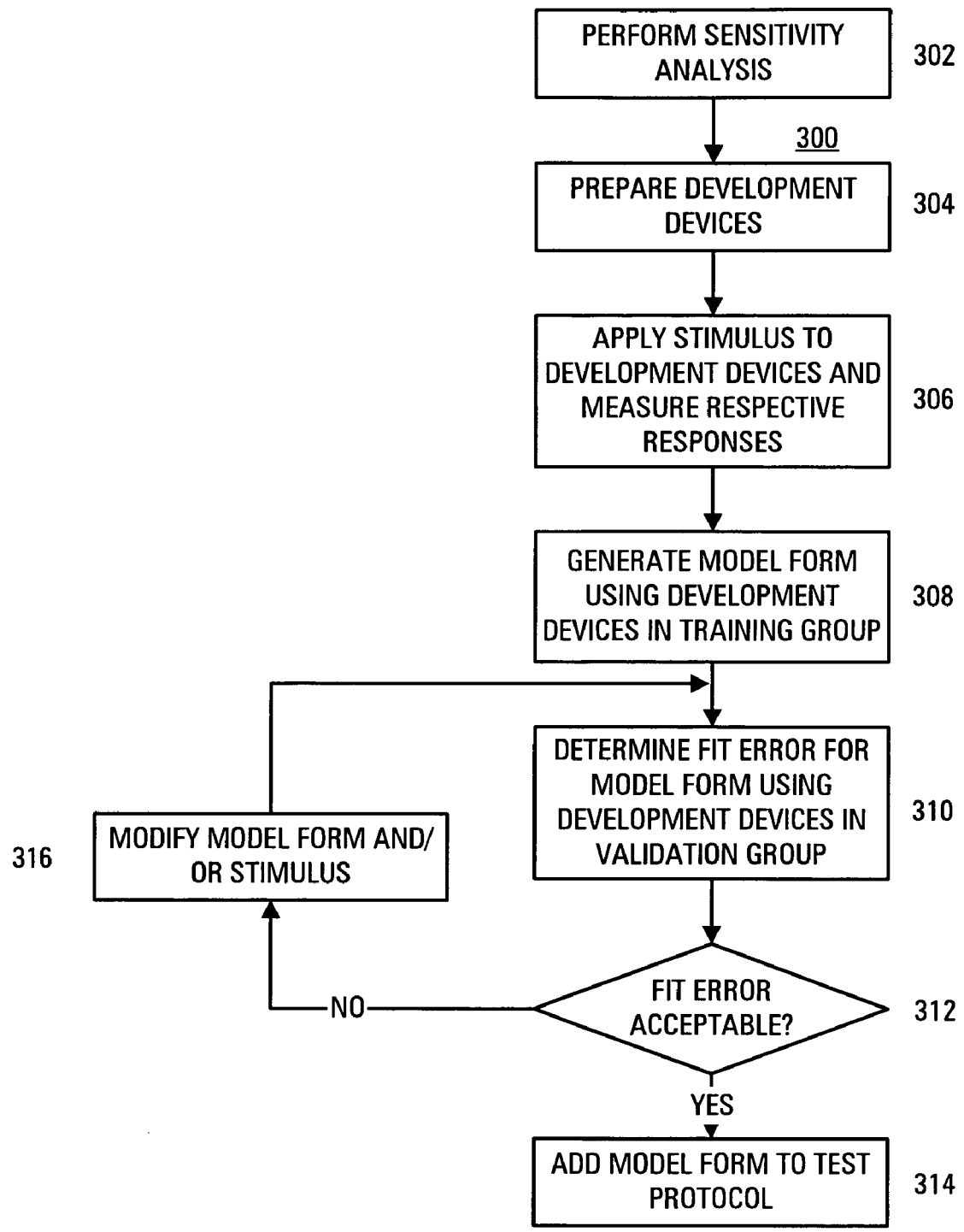
FIG. 3A is a flow diagram of an embodiment of a method in accordance with the invention that develops a model form for testing production devices.

FIG. 3A is a flow diagram showing an embodiment of a model form development method in accordance with the invention in which a model form for use in connection with testing production devices manufactured in accordance with a device design is developed using development devices from a skewed lot. In block 302, a sensitivity analysis is performed using a device netlist, e.g., a SPICE deck, for the device design and using process parameters obtained from the process data kit of the fabrication process that will be used to fabricate the production devices. The sensitivity analysis determines a subset of the process parameters to which the performance of the device design is most sensitive. The model form will be developed such that the model-based testing method will target the subset of the process parameters identified by the sensitivity analysis. In some embodiments, block 302 is omitted.

In block 304, development devices are prepared for use in the model form development process. Typically, development devices are prepared by performing manufacturing runs in which process parameters are intentionally skewed to cover the range of variations in the process parameters identified in block 302. This produces respective skewed lots of development devices. The range of variations is defined in the process data kit for the target manufacturing process.

In block 306, a stimulus is applied to the development devices prepared in block 304. The stimulus is characterized by a set of stimulus data that typically represents the waveform of the stimulus. The response of each measured development device to the stimulus is then measured and is represented a respective set of response data. Each set of response data typically represents the waveform of the response of the respective development device to the stimulus.

The development devices are then divided into two groups; a training group for use in developing the model form and a validation group for use in validating the model form. The development devices in the training group will be called training devices; the development devices in the validation group will be called validation devices. The stimulus and response data for the training devices are used in the process performed in block 308 to generate the model form and those for the validation devices are used in the process performed in block 310 to validate the model form, as will be described below.

A model form for the device design is generated in block 308. In block 308, initial equations are selected, the development devices are modeled using the equation set and values of the model form parameters extracted from stimulus/response data obtained from the development devices using the equations, and a determination is made of whether the modeling models behavior of the development devices with acceptable accuracy. When the accuracy is unacceptable, the equations are modified and the modeling and accuracy determination are repeated until the accuracy of the modeling is acceptable.

Figure 3B:
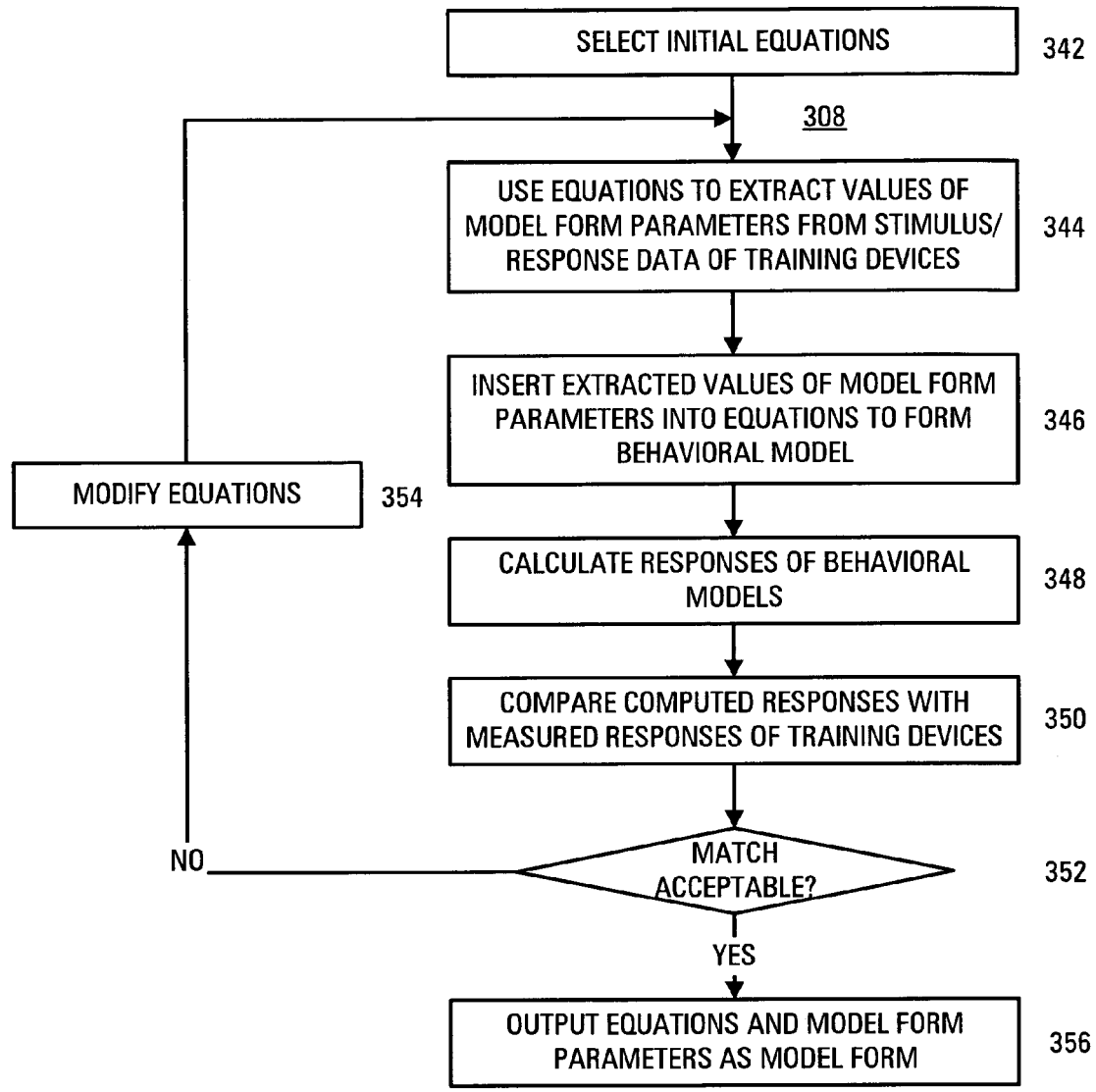
FIG. 3B is a flow diagram of an exemplary embodiment of the model form generation block of the method shown in FIG. 3A.

FIG. 3B is a flow diagram illustrating an exemplary embodiment of the processing performed in block 308. In block 342, initial non-linear equations are selected that represent the behavior of a nominal device in accordance with the device design. The initial equations constitute an initial basis function for the model form. Specifically, the selected initial non-linear equations represent aspects of the behavior of the nominal device specified in the performance specifications of the device design. The nominal device may be an actual device or a simulated device. Alternatively, non-linear equations that represent the behavior of other devices such as production devices or selected ones of the development devices are initially selected.

The stimulus data and response data gathered in block 306 for the training devices are then used to determine whether the initially-selected equations can accurately predict the measured responses of the training devices to the stimulus. In block 344, the initially-selected equations are used to extract values of the model form parameters from the stimulus data and the response data for each training device. The values of the model form parameters are extracted by applying a form-fit process as described above using the initially-selected equations. In block 346, the extracted values of the model form parameters for each training device are then inserted into the equations to produce a behavioral model of the training device. In block 348, the response of the behavioral model of each training device to the stimulus data is calculated. In block 350, the calculated response of the behavioral model of each training device is compared with the measured response of the training device. In block 352, a test is performed to determine whether the calculated responses of the behavioral models of the training devices accurately match the measured responses of the respective training devices.

When the result in block 352 is NO, the initially-selected equations are modified in block 354, and the values of the model form parameters are then extracted using the modified equations in block 344, responses of the modified models of the training devices to the stimulus are calculated in block 346, the calculated responses of the modified models are compared with the measured responses of the training devices in block 350 and the accuracy of the match is re-tested in block 352. The process just described is iterated until the modified equations accurately represent one or more desired aspects of the response of the training devices to the stimulus, i.e., until a YES result is obtained in block 352. When the result obtained in block 352 is YES, execution advances to block 356 where the equations in their current state of modification and the model form parameters are output as the model form for the device design.

Returning now to FIG. 3A, in block 310, the model form generated in block 308 is validated using the validation devices. The validation devices are development devices different from the training devices used in block 308 to develop the model form. The validation process gives a measure of the quality of the model form developed in block 308 in terms of a fit error with respect to the validation devices. The responses to the stimulus of the validation devices were measured in block 306, described above.

Figure 3C:
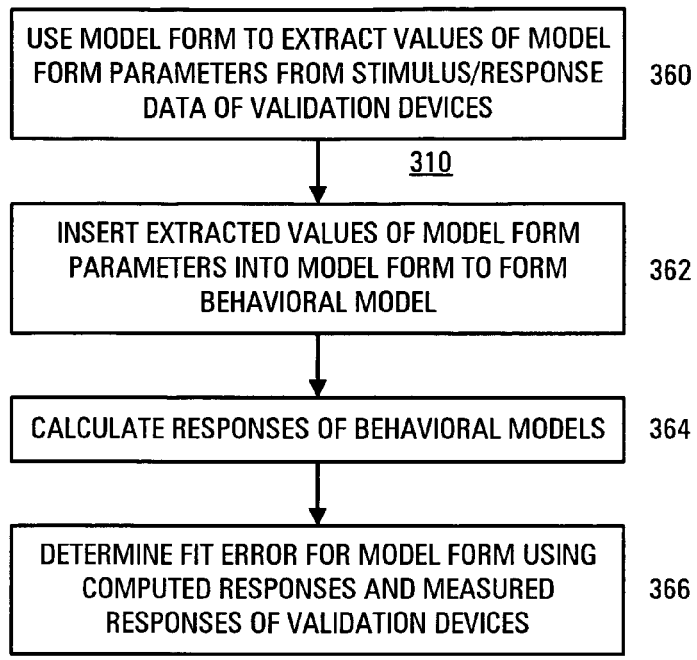
FIG. 3C is a flow diagram of an exemplary embodiment of the fit error determination block of the method shown in FIG. 3A.

FIG. 3C is a flow diagram illustrating an embodiment of the validation process performed in block 310. In block 360, values of the model form parameters are extracted from the stimulus data and the response data for each validation device. The values of the model form parameters are extracted by applying a fitting process as described above using the model form. In block 362, the extracted values of the model form parameters for each validation device are then inserted into the model form to produce a model of the validation device. In block 364, the response of the model of each validation device to the stimulus data is calculated. In block 366, a fit error for the model form is determined. The calculated response of each validation device is compared with the measured response of the validation device. Any difference between the response predicted using the model of the validation device and the measured response of the validation device constitutes a fit error of the model form with respect to the validation device. The fit errors for the validation devices constitute a cumulative fit error for the model form. The cumulative fit error provides a measure of the accuracy of the model form.

Returning again to FIG. 3A, in block 312, a test is performed to determine whether the fit error generated in block 310 for the model form generated in block 308 is acceptable. When the result obtained in block 312 is YES, execution advances to block 314, where the model form is added to the test protocol for use in testing production devices manufactured in accordance with the device design.

When the test result obtained in block 312 is NO, execution advances to block 316, where either or both the model form developed in block 308 and the stimulus used in block 306 is modified. Execution returns to block 310, and the model form validation process of blocks 310, 312, 314 and 316 is iterated until an acceptable fit error is obtained, i.e., until the test result obtained in block 312 is YES.

The validation process of blocks 310, 312, 314 and 316 may be omitted in some embodiments. The validation process just described may alternatively be performed using simulated development devices as will described below.

Validation processes different from that described above with reference to FIG. 3C may be performed in block 310. For example, each validation device may be fully characterized using a set of conventional tests similar to that described above with reference to FIG. 1 to generate respective performance metrics. The above-described behavioral models of the validation devices are also characterized by calculating their responses to stimuli corresponding to those used in the conventional tests, and calculating respective performance metrics from the stimuli and the calculated responses. Differences between the calculated performance metrics and the corresponding measured performance metrics are determined. The differences for the test devices provide a measure of the accuracy of the model form. The accuracy measure is then used instead of the fit error in block 312.

The model form development process described above with reference to FIG. 3A may be performed using simulated development devices. In block 304, development device simulations are generated using a simulator, such as a CAD software program. The simulator generates the development device simulations using a complex model of the device design. The complex model typically has thousands of parameters. The device simulations are typically performed with process parameters intentionally skewed to cover the range of variations in the process parameters identified in block 302. The range of variations is defined in the process data kit for the target manufacturing process.

In block 306, a set of stimulus data is applied to each simulated development device and the response of the simulated development device to the set of stimulus data is calculated to generate a respective set of response data. The set of stimulus data typically represents the waveform of a stimulus. Each set of the response data typically represents the waveform of the calculated response of the simulated development device to the set of stimulus data.

The simulated development devices are then divided into two groups as described above, i.e., training devices for use in developing the model form and validation devices for use in validating the model form. In block 308, the model form for the device design is generated using the simulated training devices and a model form generation process similar to that described above with reference to FIG. 3B. In block 310, the model form generated in block 308 is validated using the simulated validation devices and a process similar to that described above with reference to FIG. 3C. The validation process gives a measure of the quality of the model form developed in block 308 in terms of a fit error with respect to the simulated validation devices. The model form generation and the model form validation process just described are iterated until an acceptable fit error is obtained, i.e., the test result obtained in block 312 is YES.

Figure 4:
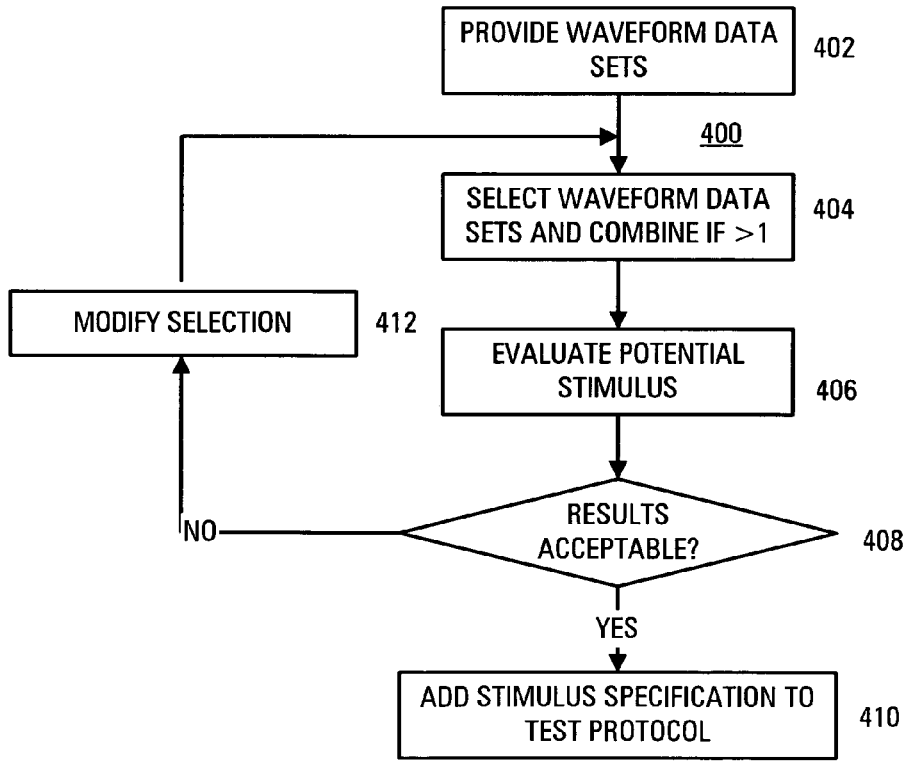
FIG. 4 is a flow diagram showing an embodiment of a method in accordance with the invention for specifying a stimulus.

In an embodiment in which the model form generation process of block 308 is performed using simulated development devices, the model form validation process of block 310 may alternatively be performed using real development devices as described above with reference to FIG. 3A FIG. 4 is a flow diagram showing an embodiment of the processing performed in accordance with the invention in block 214 of FIGS. 2A-2D to specify the stimulus. In block 402 a library of sets of waveform data is provided. Each set of waveform data represents a respective waveform. For example, the waveforms represented by the waveform data are characterized by respective frequencies, amplitudes, phases and envelopes. Examples of the waveforms represented by the sets of waveform data include sine waves, noise, shaped noise, piecewise linear waveforms, step functions and pulses.

In block 404, at least one of the sets of waveform data is selected as a potential stimulus. When more than one set of waveform data is selected, the sets of waveform data are additionally merged to generate a set of waveform data representing a composite waveform. For example, sets of waveform data representing a carrier signal and a modulation signal may be merged to generate a set of waveform data representing a modulated carrier.

In block 406, the fitness of the potential stimulus generated in block 404 is evaluated. The set of waveform data is converted to a stimulus and the stimulus is applied to one or more development devices. The response of each development device to the stimulus is measured to provide response data. Alternatively, the set of waveform data representing the potential stimulus is applied to a one or more simulated development devices and the response of each simulated development device to the waveform data is calculated. The measured or calculated response data is then evaluated.

Selected sets of waveform data are deemed to be "fit" when the stimulus waveform generated in response to the waveform data is optimized for the extraction of the values of the model form parameters from the stimulus and the response of the production devices to the stimulus. Such a stimulus waveform enables the values of the model form parameters to be extracted that enable the behavioral model obtained by inserting the values of the model form parameters into the model form to predict accurately the properties of each production device with the simplest and fastest possible measurement process. As noted above, the stimulus can be specified to provide a specified balance between speed, accuracy and complexity. One aspect of the accuracy of the prediction provided by the behavioral model is characterized in terms of the responsiveness of the prediction to the process parameter variations identified in process 302 of FIG. 3A.

In block 408, a test is performed to determine whether the results of the evaluation performed in block 406 are acceptable. When the test result obtained in block 408 is YES, execution advances to block 410, where the stimulus specification defining the stimulus evaluated in block 406 is added to the test protocol produced by development phase 210. When the test result obtained in block 408 is NO, execution advances to block 412, where the selection of the sets of waveform data is modified in block 412, and blocks 404, 408 and 412 are repeated until the test result obtained in block 408 is YES.

Figure 5:
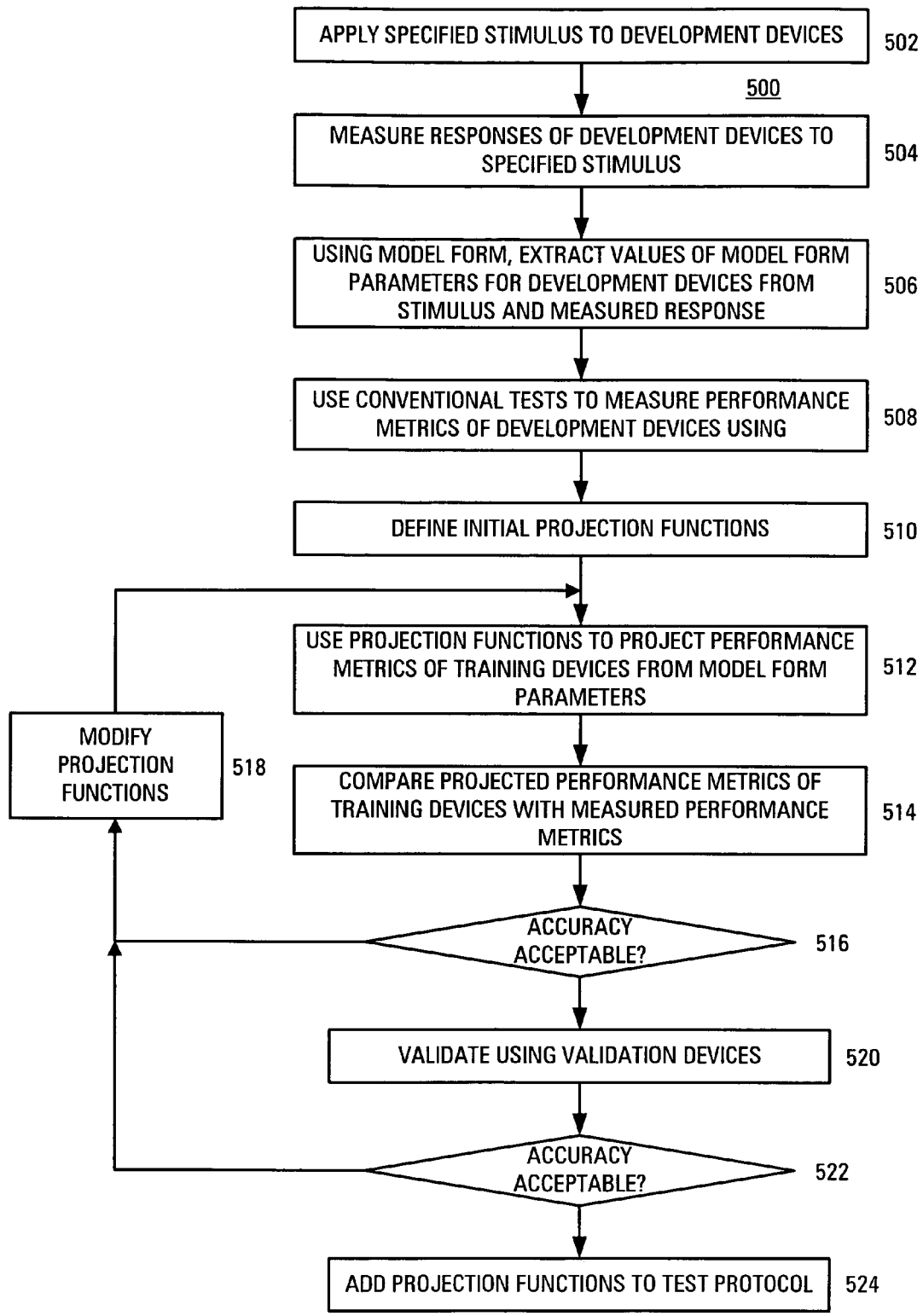
FIG. 5 is a flow diagram of an embodiment of a method in accordance with the invention for defining the projection functions used in the example shown in FIG. 2C.

FIG. 5 is a flow diagram of an embodiment 500 of the method in accordance with the invention performed in block 216 of the model-based testing method in accordance with the invention described above with reference to FIG. 2C for defining the projection functions used in block 240. The method is typically performed using the development devices used in the embodiments of the model form development process described above with reference to FIG. 3A. The method 500 will be described next with reference to an example in which the development devices are real development devices. The method can alternatively use simulated development devices. The method can alternatively use devices different from the development devices used to develop the model form.

In block 502, the stimulus specified in block 214 of FIG. 2C and represented by a set of stimulus data is applied to each development device.

In block 504, the response of each development device to the stimulus is measured to provide a respective set of response data.

In block 506, the model form developed in block 212 of FIG. 2C is used to extract the values of the model form parameters for each development device from the set of stimulus data and the set of response data for the development device. The development devices are then divided into training devices and validation devices, as discussed above.

The values of the model form parameters of the development devices may be available from their use in developing the model form in block 212. In this case, the values of the model form parameters can be re-used and blocks 502, 504 and 506 omitted from method 500.

In block 508, each development device is fully characterized using a set of conventional tests similar to that described above with reference to FIG. 1 to generate respective measured performance metrics.

In block 510, initial projection functions for projecting the performance metrics of production devices from values of the model form parameters are defined. For example, projection functions that correlate the model form parameters of a real or simulated nominal development device to the measured or simulated performance metrics of such nominal development device can be used.

In block 512, the initial projection functions are applied to the values of the model form parameters of each training device to project respective performance metrics for the training device.

In block 514, the projected performance metrics of each training device are compared to the corresponding performance metrics measured in block 508. Differences between the projected performance metrics and the corresponding measured performance metrics are determined.

In block 516, the projection accuracy of the projection functions is tested. In the test, the accuracy with which the projection functions project the performance metrics of the training devices is compared with an acceptability standard. The differences generated in block 514 for all the training devices are analyzed to determine the projection accuracy.

When the test result obtained in block 516 is NO, execution advances to block 518, where the projection functions are modified with the aim of increasing the projection accuracy provided by the projection functions. Blocks 512, 514, 516 and 518 are then iterated until the test result obtained in block 516 is YES.

When the test result obtained in block 516 is YES, execution advances to block 520, where the projection functions that produce the YES result in block 516 are validated using the validation devices. Processes similar to those described above with reference to blocks 512, 514 and 516 are performed using the validation devices.

In block 522, the projection accuracy of the projection functions that produce the YES result in block 516 is tested in a manner similar to that described above with reference to block 516. The same or different acceptability limits may be used.

When the test result obtained in block 522 is NO, execution advances to block 518, where the projection functions are modified with the aim of increasing the projection accuracy provided by the projection functions with respect to the validation devices. Blocks 512, 514, 516 and 518 are iterated using the training devices until the test result obtained in block 516 is YES. Then, blocks 520 and 522 are repeated using the validation devices. This process just described is repeated until the test result obtained in block 522 is YES.

When the test result obtained in block 522 is YES execution advances to block 524, where the projection functions are added to the test protocol generated by development phase 210.

In some embodiments, validation processes 520 and 522 are omitted. In this case, the projection functions found acceptable in block 516 are added to the test protocol in block 524.

Figure 6:
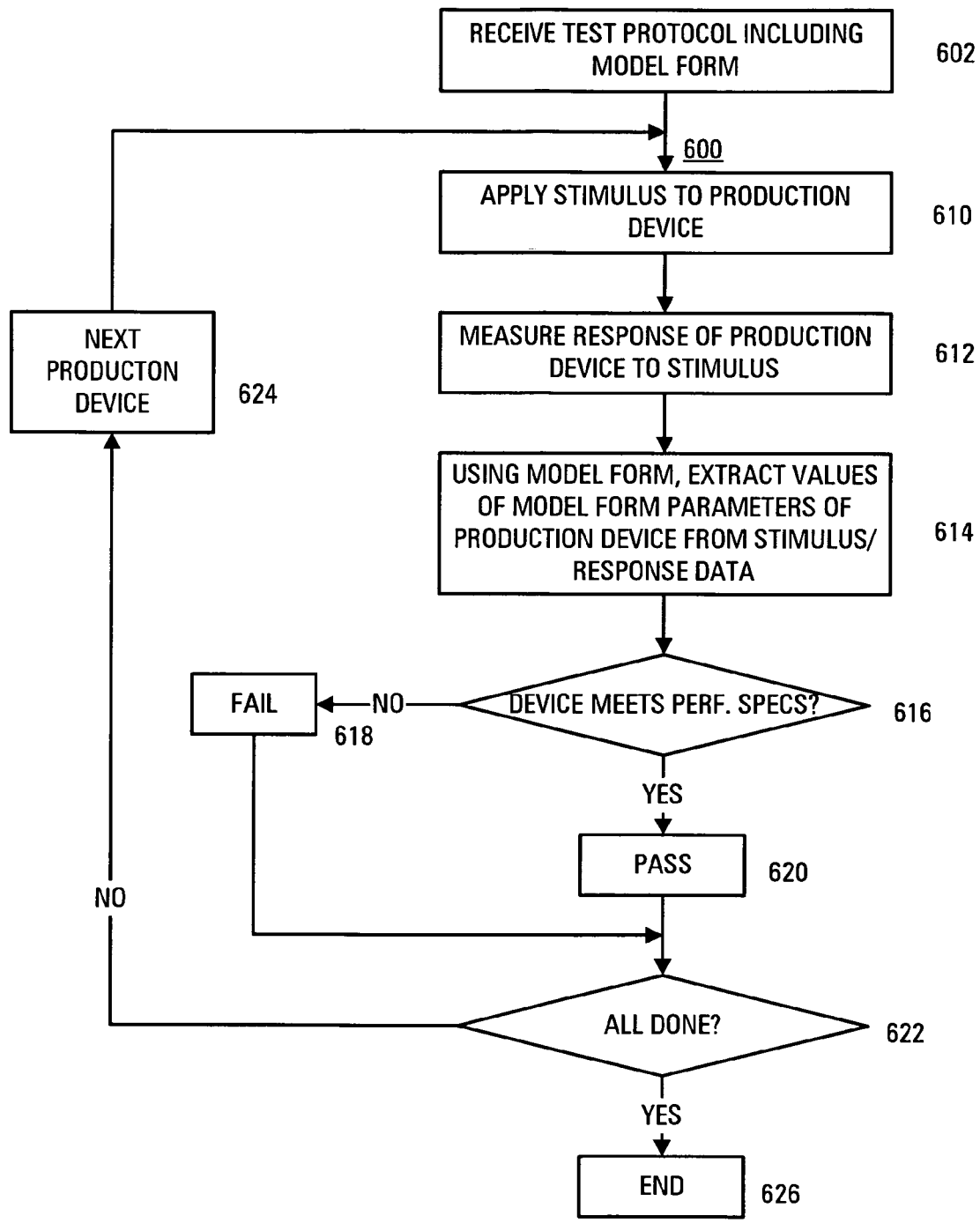
FIG. 6 is a flow diagram illustrating an embodiment of a model-based testing method in accordance with the invention for testing production devices.

FIG. 6 is a flow diagram of an exemplary embodiment 600 of a model-based method in accordance with the invention for testing production devices.

In block 602, a test protocol for testing the production devices is received. The test protocol comprises a model form based on the device design. The model form comprises a basis function and process-dependent model form parameters. The model form parameters differ in value among the production devices. The test protocol additionally comprises a specification of a stimulus to be used to test the production devices and a specification of measurements to be performed on the response of the productions devices to the stimulus.

In block 610, a stimulus in accordance with the stimulus specification is applied to a production device.

In block 612, the response of the production device to the stimulus is measured.

In block 614, the model form is used to extract values of the model form parameters for the production device from the stimulus and the response, or, more typically, a stimulus data set representing the stimulus and a response data set representing the response of the production device to the stimulus.

In block 616, a test is performed to determine whether the production device complies with the performance specifications of the device design using the values of the model form parameters. Block 616 may be embodied in accordance with any one of the examples of block 226 described above with reference to FIGS. 2B, 2C and 2D. Alternatively, block 616 may be differently embodied. In one embodiment, compliance of the production device with its performance specifications is directly checked using the values of the model form parameters extracted in block 614. In this case, the test protocol received in block 602 additionally comprises the performance specifications of the device design transformed into the model form parameter space and, in block 616, compliance of the model form parameters with the performance specifications transformed into the model form parameter space is tested. In another embodiment, the test protocol received in block 602 additionally comprises projection parameters for projecting performance metrics from the model form parameters. In this case, compliance of the production device with the performance specifications of the device design is checked in block 616 using performance metrics projected the projection functions from the values of the model form parameters of the production device. In another embodiment, compliance of the production device with the performance specifications of the device design is checked in block 616 using performance metrics projected from the values of the model form parameters by inserting the values of the model form parameters extracted in block 614 into the model form to form a behavioral model of the production device. Responses of the behavioral model to one or more stimuli are calculated and the performance metrics are projected from the stimulus data and respective response data calculated using the behavioral model.

When the test result obtained in block 616 is NO, execution advances to block 618, where the production device is classified as BAD. Execution then advances to block 622. When the test result obtained in block 616 is YES, execution advances to block 620, where the production device is classified GOOD. Execution then advances to block 622. In block 622, a test is performed to determine whether all production devices have been tested in accordance with the test protocol.

When the test result obtained in block 622 is NO, execution advances to block 624, where the next production device is selected for testing. Execution then returns to block 610 to test the next production device. When the test result obtained in block 622 is YES, execution advances to block 626, where it stops.

This disclosure describes the invention in detail using illustrative embodiments. However, the invention defined by the appended claims is not limited to the precise embodiments described.

We claim:

1. A model-based method for testing compliance of production devices with performance specifications of a device design, the production devices manufactured in accordance with the device design by a manufacturing process, the method comprising:
   developing a simple model form based on the device design and the performance specifications, the model form comprising a basis function and model form parameters for the basis function, the model form parameters being manufacturing process dependent and differing in value among the production devices;
   specifying a stimulus for testing the production devices;
   testing each production device, the testing comprising:
      measuring a response of the production device to the stimulus,
      using the model form, extracting the values of the model form parameters for the production device from the measured response and the stimulus, and
      checking compliance of the production device with the performance specifications using the extracted values of the model form parameters; and
   classifying ones of the production devices as good or bad based on said compliance checking.

2. The method of claim 1, additionally comprising defining projection functions for projecting performance metrics for the production device from the extracted values of the model form parameters.

3. The method of claim 2, in which the checking comprises:
   using the projection functions, projecting the performance metrics for the production device from the extracted values of the model form parameters; and
   checking compliance of the performance metrics with respective ones of the performance specifications.

4. The method of claim 1, in which:
   the method additionally comprises:
      inserting the extracted values of the model form parameters for the production device into the model form to form a behavioral model of the production device, and
      projecting performance metrics for the production device using the behavioral model; and the checking comprises checking compliance of the performance metrics with respective ones of the performance specifications.

5. The method of claim 4, in which the projecting comprises:
applying a conventional stimulus to the behavioral model;
determining a response of the behavioral model to the conventional stimulus; and
determining one of the performance metrics from the stimulus and the response.

6. The method of claim 4, in which:
the conventional stimulus is simulated; and
the determining comprises calculating the response of the behavioral model to the simulated stimulus to provide the one of the performance metrics.

7. The method of claim 1, in which:
the method additionally comprises transforming the performance specifications of the device design into a model form parameter space; and
the checking comprises checking compliance of the extracted values of the model form parameters with the performance specifications transformed into the model form parameter space.

8. The method of claim 1, in which the basis function comprises a non-linear equation.

9. The method of claim 1, in which the basis function has fewer than one hundred model form parameters.

10. The method of claim 1, additionally comprising verifying the model form.

11. The method of claim 10, in which the developing and the verifying are performed using different sets of devices in accordance with the device design.

12. The method of claim 10, in which the verifying is performed using simulated devices in accordance with the device design.

13. A method of generating a model-based testing protocol for testing compliance of production devices with performance specifications of a device design, the production devices manufactured in accordance with the device design by a manufacturing process, the method comprising:
developing a model form based on the device design and the performance specifications using a computer, the model form comprising a basis function and model form parameters for the basis function, the model form parameters being manufacturing process dependent and differing in value among the production devices;
using the model form, specifying a stimulus for use in testing the production devices;
incorporating the model form and a specification of the stimulus into the testing protocol; and
storing the testing protocol for later testing of the production devices.

14. The method of claim 13, additionally comprising:
defining projection functions for projecting performance metrics for the production devices from the values of the model form parameters; and
adding the projection functions to the testing protocol.

15. The method of claim 13, in which the defining comprises:
providing development devices;
defining an initial projection function;
determining whether a performance metric projected for the development devices using the initial projection function matches a corresponding performance metric measured on the development devices with acceptable accuracy;
modifying the projection function when the accuracy is unacceptable; and
iterating the determining and the modifying until the accuracy is acceptable.

16. The method of claim 13, additionally comprising:
transforming the performance specifications of the device design into a model form parameter space; and
adding the transformed performance specifications to the test protocol.

17. The method of claim 13, in which the developing comprises:
providing development devices;
selecting an initial non-linear equation set based on the device design, the equation set comprising model form parameters;
modeling the development devices using the equation set and values of the model form parameters extracted from stimulus/response data obtained from the development devices using the equations;
determining whether the modeling models behavior of the development devices with acceptable accuracy.

18. The method of claim 17, additionally comprising:
modifying the initial equation set when the accuracy is unacceptable; and
iterating the modeling, the determining and the modifying until the accuracy is acceptable.

19. The method of claim 17, in which the modeling comprises:
obtaining stimulus/response data for the development devices;
extracting values of the model form parameters from the stimulus/response data using the equation set; and
inserting the extracted values of the model form parameters into the equation set to create behavioral models.

20. The method of claim 17, in which:
the manufacturing process is characterized by process parameters having respective ranges; and
the development devices are devices manufactured using the manufacturing process with ones of the process parameters having different values within the respective ranges.

21. The method of claim 17, in which:
the manufacturing process is characterized by process parameters having respective ranges; and
the development devices are simulated devices defined to account for the ranges of the process parameters.

22. The method of claim 13, in which the specifying comprises:
selecting initial stimulus waveforms;
determining whether a stimulus defined by the initial stimulus waveforms is capable of generating stimulus/response data from which the values of the model form parameters can be extracted with acceptable efficiency;
modifying the selection of the stimulus waveforms when the efficiency is unacceptable; and
iterating the determining and the modifying until the efficiency is acceptable.

23. The method of claim 13, in which the basis function comprises a non-linear equation.

24. The method of claim 13, in which the basis function has fewer than one hundred model form parameters.

25. A method for model-based testing of compliance of production devices with performance specifications of a device design, the production devices manufactured in accordance with the device design by a manufacturing process, the method comprising:

receiving a test protocol for testing the production devices, the protocol comprising a simple model form based on the device design and the performance specifications, the model form comprising a basis function and model form parameters for the basis function, and a specification of a stimulus for use in testing the production devices, the model form parameters being manufacturing process-dependant and differing in value among the production devices;

testing each production device in accordance with the test protocol, the testing comprising:

measuring a response of the production device to the stimulus, using the model form, extracting values of the model form parameters for the production device from the measured response and the stimulus, and checking compliance of the production device with the performance specifications using the values of the model form parameters; and classifying ones of the production devices as good or bad based on said compliance checking.

26. The method of claim 25, in which:

the testing additionally comprises projecting the performance metrics for the production device from the extracted values of the model form parameters; and the checking comprises checking compliance of the performance metrics with respective ones of the performance specifications.

27. The method of claim 26, in which the projecting comprises:

inserting the extracted values of the model form parameters for the production device into the model form to form a behavioral model of the production device;

projecting the performance metrics using the behavioral model.

28. The method of claim 27, in which the projecting comprises:

applying a conventional stimulus to the behavioral model; and determining a response of the behavioral model to the conventional stimulus to obtain one of the performance metrics.

29. The method of claim 28, in which:

the conventional stimulus is simulated; and the determining comprises calculating the response of the behavioral model to the simulated stimulus to provide the one of the performance metrics.

30. The method of claim 26, in which:

the test protocol additionally comprises projection functions for projecting the performance metrics for the production device from the extracted values of the model form parameters; and the projecting comprises projecting the performance metrics for the production device using the projection functions.

31. The method of claim 26, in which:

the measuring is performed using an automatic tester; and the projecting is performed externally of the automatic tester.

32. The method of claim 26, in which the measuring and the projecting are performed using an automatic tester.

33. The method of claim 25, in which:

the test protocol additionally comprises the performance specifications of the device design transformed into a model form parameter space; and the checking comprises checking compliance of the extracted values of the model form parameters with the performance specifications transformed into the model form parameter space.

34. The method of claim 25, in which, in the measuring, no more than one stimulus is applied to the production device.

35. The method of claim 25, in which the testing is performed using an automatic tester.

36. The method of claim 25, in which:

the testing is performed using an automatic tester; and the extracting is performed externally of the automatic tester.

37. The method of claim 25, in which the testing and the extracting are performed using an automatic tester.

* * * * *